United States Patent
Song et al.

(10) Patent No.: US 9,615,185 B2
(45) Date of Patent: Apr. 4, 2017

(54) DYNAMIC SOUND ADJUSTMENT

(71) Applicant: Bose Corporation, Framingham, MA (US)

(72) Inventors: Zukui Song, Wellesley, MA (US); Shiufun Cheung, Lexington, MA (US); Michael S. Dublin, Arlington, MA (US)

(73) Assignee: Bose Corporation, Framingham, MA (US)

( * ) Notice: Subject to any disclaimer, the term of this patent is extended or adjusted under 35 U.S.C. 154(b) by 129 days.

(21) Appl. No.: 14/224,745

(22) Filed: Mar. 25, 2014

(65) Prior Publication Data

US 2015/0281864 A1    Oct. 1, 2015

(51) Int. Cl.
*H04R 29/00* (2006.01)
*H03G 5/16* (2006.01)
*H03G 3/32* (2006.01)

(52) U.S. Cl.
CPC ............... *H04R 29/00* (2013.01); *H03G 3/32* (2013.01); *H03G 5/165* (2013.01); *H04R 2430/01* (2013.01); *H04R 2499/13* (2013.01)

(58) Field of Classification Search
None
See application file for complete search history.

(56) References Cited

U.S. PATENT DOCUMENTS

| | | | |
|---|---|---|---|
| 1,931,596 A * | 10/1933 | Wheeler | H03G 5/06 330/155 |
| 4,944,018 A | 7/1990 | Bose et al. | |
| 5,034,984 A | 7/1991 | Bose | |
| 5,434,922 A | 7/1995 | Miller et al. | |
| 5,615,270 A | 3/1997 | Miller et al. | |
| 5,907,622 A * | 5/1999 | Dougherty | H03G 3/32 381/108 |
| 2004/0052384 A1 | 3/2004 | Ashley et al. | |
| 2009/0310793 A1 | 12/2009 | Ohkuri et al. | |
| 2011/0095875 A1 | 4/2011 | Tyssen et al. | |
| 2012/0177221 A1* | 7/2012 | Christoph | H03G 3/32 381/94.1 |

(Continued)

FOREIGN PATENT DOCUMENTS

WO    WO 2007/120453    10/2007

OTHER PUBLICATIONS

International Search Report and Written Opinion; PCT/US2015/022228; Oct. 13, 2015; 17 pp.

(Continued)

*Primary Examiner* — Curtis Kuntz
*Assistant Examiner* — Kenny Truong
(74) *Attorney, Agent, or Firm* — Fish & Richardson P.C.

(57) ABSTRACT

Among other things, one or more non-transitory machine-readable media storing instructions are described. The stored instructions are executable by one or more processing devices to perform operations comprising analyzing an effect of noise in a spatial unit on sound in the spatial unit, at least part of the sound being produced by audio signals; selecting an adjustment curve among a group of adjustment curves based on one or more characteristics of the noise; and determining an amount of adjustment to be made to the audio signals based on the analyzed effect and the selected adjustment curve.

30 Claims, 9 Drawing Sheets

(56) References Cited

U.S. PATENT DOCUMENTS

2013/0304475 A1* 11/2013 Gratke .................... H04R 3/00
704/270
2014/0079243 A1* 3/2014 Appell .................... H03G 3/32
381/86

OTHER PUBLICATIONS

Invitation to Pay Additional Fees and, Where Applicable, Protest Fee and Communication Relating to the Results of the Partial International Search; PCT/US2015/022228; Jul. 7, 2015.

* cited by examiner

DYNAMIC SOUND ADJUSTMENT

TECHNICAL FIELD

This disclosure generally relates to dynamic sound adjustment, e.g., to overcome the effect of noise on sound reproduction in a moving vehicle.

BACKGROUND

The reproduction of music or speech in a moving vehicle may be degraded by variable acoustic noise present in the vehicle. This noise may result from, and be dependent upon, vehicle speed, road condition, weather, and condition of the vehicle. The presence of increased noise may hide soft sounds of interest and lessen the fidelity of music or the intelligibility of speech. A driver and/or passenger(s) of the vehicle may partially compensate for the increased noise by increasing the volume of the audio system. However, when the vehicle speed decreases or the noise goes away, the increased volume of the audio system may become too high, requiring the driver or the passenger(s) to decrease the volume. A frequent need to increase and decrease the volume is an inconvenience and can also be a safety hazard because it can distract the driver's attention.

SUMMARY

In one aspect, the disclosure features one or more non-transitory machine-readable media storing instructions that are executable by one or more processing devices to perform operations comprising: analyzing an effect of noise in a spatial unit on sound in the spatial unit, at least part of the sound being produced by audio signals; selecting an adjustment curve among a group of adjustment curves based on one or more characteristics of the noise; and determining an amount of adjustment to be made to the audio signals based on the analyzed effect and the selected adjustment curve.

In another aspect, the disclosure features a controller comprising a processor and a storage device that stores a program for execution by the processor. The program comprises instructions configured to cause the processor to perform operations comprising: analyzing an effect of noise in a spatial unit on sound in the spatial unit, at least part of the sound being produced by audio signals; selecting an adjustment curve among a group of adjustment curves based on one or more characteristics of the noise; and determining an amount of adjustment to be made to the audio signals based on the analyzed effect and the selected adjustment curve.

In another aspect, the disclosure features a system comprising an acoustic system for producing audio signals, a detector for detecting sound, and a controller. At least part of the sound is produced by the audio signals and the sound comprising noise. The controller is configured to perform operations comprising: analyzing an effect of noise in a spatial unit on sound in the spatial unit; selecting an adjustment curve among a group of adjustment curves based on one or more characteristics of the noise; and determining an amount of adjustment to be made to the audio signals based on the analyzed effect and the selected adjustment curve.

In another aspect, the disclosure features one or more non-transitory machine-readable media storing instructions that are executable by one or more processing devices to perform operations comprising: comparing a first noise measurement in a first frequency band with a second noise measurement in a second frequency band different from the first frequency band; determining a first gain value based on the comparison of the first and second noise measurements; and applying the first gain value to one or more first signal components of an audio signal.

Embodiments of the one or more non-transitory machine-readable media, controllers, and systems may include one or more of the following features. Analyzing the effect of noise on the sound comprises calculating a signal to noise ratio. The operations comprise determining the characteristics of the noise. The characteristics of the noise comprise a first level of noise energy in a first frequency band and a second level of noise energy in a second frequency band. Different adjustment curves correspond to different ratios of the first level to the second level. The spatial unit comprises a cabin of a moving vehicle and the noise comprises wind noise. The audio signals span a spectral frequency and selecting an adjustment curve comprises selecting a first adjustment curve for a first band of the frequency range among a first group of adjustment curves for the first band and selecting a second adjustment curve for a second band of the frequency range among a second group of adjustment curves for the second band. Determining an adjustment comprises determining a first adjustment for the audio signals in the first band and a second adjustment for the audio signals in the second band, the first and second adjustments being determined independently. The analyzing, the selecting, and the determining are performed in real time. Selecting an adjustment curve comprises selecting a third adjustment curve for a third band of the frequency range among a third group of adjustment curves determined for the third band, and the first, second and third bands form the entire spectral frequency range. The operations comprise performing the adjustment to the audio signals. Comparing the first noise measurement with the second noise measurement comprises calculating a ratio of the first noise measurement in the first frequency band and the second noise measurement in the second frequency band. Determining the first gain value comprises: identifying a first adjustment curve based on the comparison of the first and second noise measurements; calculating a signal to noise ratio (SNR); and determining the first gain value based on the calculated SNR and the first adjustment curve. Identifying the first adjustment curve comprises interpolating the first adjustment curve from a first predefined set of adjustment curves. A second gain value is determined based on the comparison; and the second gain value is applied to one or more second signal components of the audio signal. The one or more first signal components are in a low frequency band, and the one or more second signal components are in a high frequency band. Determining the second gain value comprises: identifying a second adjustment curve based on the comparison of the first and second noise measurements; calculating a signal to noise ratio (SNR); and determining the second gain value based on the calculated SNR and the second adjustment curve. A third gain value is determined based on the comparison; and the third gain value is applied to one or more third signal components of the audio signal. The one or more third signal components are in a third mid-frequency band. At least some frequencies of the one or more third signal components is lower than frequencies of the high frequency band and higher than frequencies of the low frequency band. Determining the third gain value comprises: identifying a third adjustment curve based on the comparison of the first and second noise measurements; calculating a signal to noise ratio (SNR); and determining the third gain value based on the calculated SNR and the third adjustment curve. The first noise measurement comprises first noise energy in the first frequency band, and the second noise measurement comprises second noise energy in the second frequency band.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DETAILED DESCRIPTION

Overview

Figure 1:
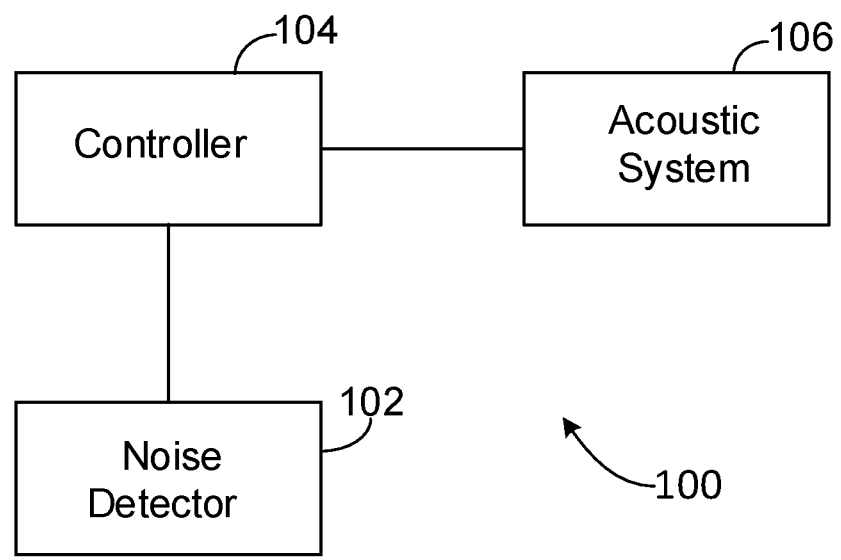
FIG. 1 is a block diagram showing an example audio control system.

FIG. 1 shows a block diagram of an example audio control system 100 installed in a vehicle (not shown). The audio control system 100 is configured to mitigate effects of variable noise on the listening experience by adjusting, automatically and dynamically, the music or speech signals played by an acoustic system 106 in a moving vehicle. The system 100 therefore promotes a consistent listening experience without typically requiring significant manual intervention. In this example, the audio control system 100 includes one or more controllers 104 in communication with one or more noise detectors 102 and an acoustic system 106. An example of a noise detector includes a microphone placed in a cabin of the vehicle. The microphone is typically placed at a location near a user's ears, e.g., along a headliner of the passenger cabin. Other examples of noise detectors include speedometers and electronic data pertaining to engine revolutions per minute, which can provide information that is indicative of the level of noise perceived in the passenger cabin. An example of a controller includes, but is not limited to, a processor, e.g., a microprocessor. The acoustic system 106 outputs sound into the vehicle based on the input signals of music or speech.

Mitigation of the effect of noise on the perceived sound can be achieved by adjusting the audio signals used for playback by the acoustic system 106 in two or more spectral bands. The adjustment may be done automatically, i.e. without manual intervention. The controller(s) 104 are programmed to analyze continuously the noise detected by the detector(s) 102 and the sound produced by the acoustic system 106. The controller(s) 104 may be programmed to interact with the acoustic system 106 to adjust the audio signals based on the analysis, e.g., to modify the gain. The signals can be adjusted in two or more spectral bands independently of each other. The analysis and adjustment can be performed using computer programs executed by the controller(s). In some cases, different computer program processes or different parts of processes are encoded in different program modules.

Figure 2:
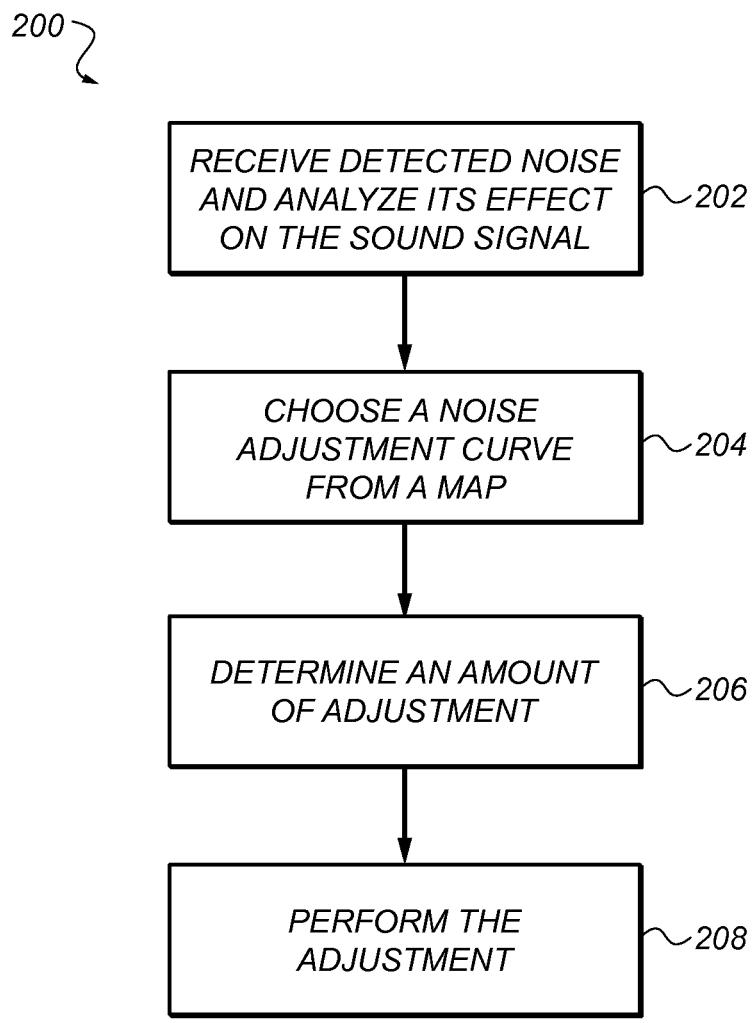
FIG. 2 is a flow diagram showing an example process performed by an audio control system in making an audio adjustment.

FIG. 2 is a flow diagram illustrating an example process 200 in which the audio control system 100 of FIG. 1 automatically adjusts audio signals in real time in response to the noise changes in a vehicle. According to process 200, upon receiving detected noise from detector(s) 102, the controller(s) analyzes (202) the effect of the noise on the sound perceived within the vehicle, which is the output of the acoustic system 106. Based on the analysis (202), the controller(s) chooses (204) an adjustment curve from a group, or family, of adjustment curves, which is also referred to as the adjustment map. The adjustment map may be stored in memory and accessible to the controller(s) or stored in internal controller memory. As described in more detail below, the adjustment map can be predetermined and the chosen adjustment curve is a curve in the family of curves that best addresses (e.g., corrects for, compensates for, or the like) the deleterious effect of the noise. The controller(s) determines (206) an amount of adjustment to be made to each of a predetermined number of spectral bands of the current signals. The determination can be made based on the noise effect and the selected adjustment curve for a specific band. The adjustment may be performed (208) in each spectral band independently of the other spectral band(s).

Figure 3:
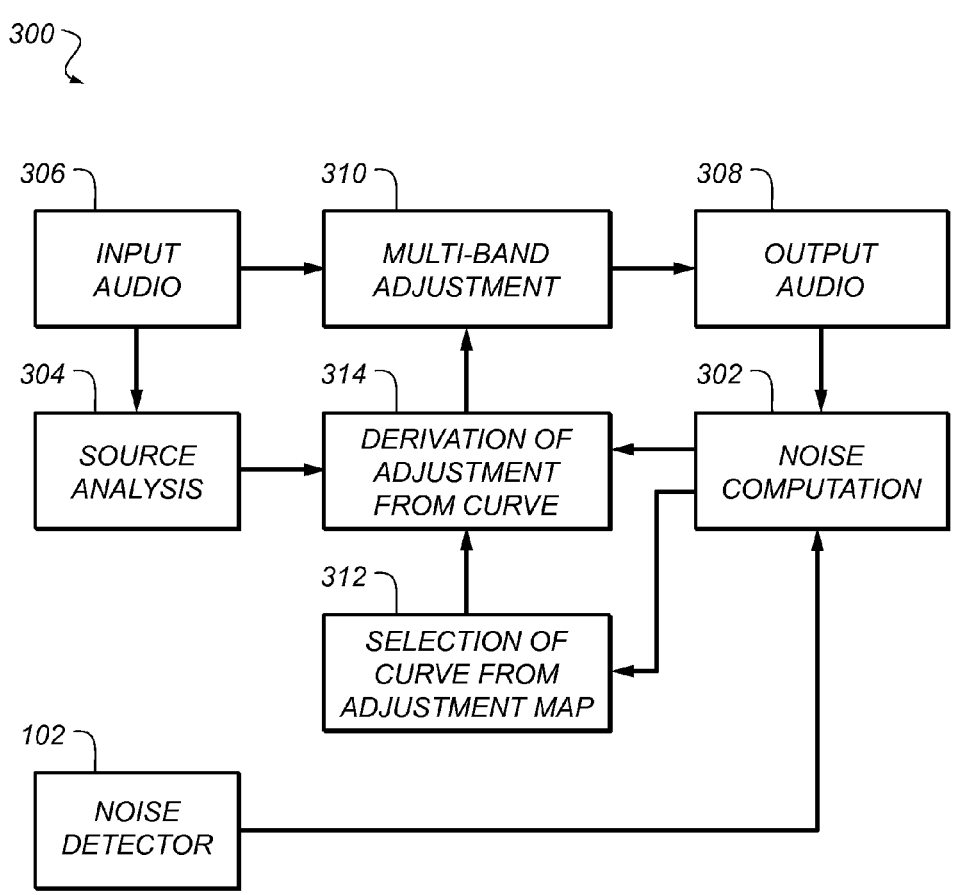
FIG. 3 is a block diagram showing example interactions among different parts of an audio control system in making an audio adjustment.

FIG. 3 is a block diagram showing example interactions that occur among different parts of the audio control system 100 during the example process 200 of FIG. 2. As shown in FIG. 3, noise detector 102 delivers data corresponding to the detected noise level in the vehicle to the controller(s) 104. A module 302, which may be executed by the controller(s), receives the data and separates the noise, e.g., using adaptive filtration, from the current output audio 308. In some implementations, module 302 is configured to estimate separately low- and high-frequency noise levels to allow the audio control system to adjust the signals to compensate for effects from noise with different spectral shapes. Typically, the low-frequency noise can originate from, or be dependent on, vehicle speed, road conditions, engines conditions, etc. Typically, the high-frequency noise can originate from wind, rain, or the vehicle passing over bridges or through tunnels. A source-analysis module 304, which can be a lossy-peak level detector, executed by the controller(s) analyzes the sound from input audio 306, which is produced by the acoustic system 106. The controller(s) use the information from the noise-detection module 302 to select adjustment curves from an adjustment map on a storage device 312. Another module 314, also executed by the controller(s), then combines the information from the source-analysis module 304 and the noise-detection module 302 to calculate SNR (signal-to-noise ratio) values. The SNR values are used to determine adjustment values from the selected adjustment curves. Based on the derived adjustment values, the controller performs multi-band, e.g., dual-band or three-band, spectral adjustment 310 to the input audio 306.

Adjustment Maps

1. Construction

Figure 4A:
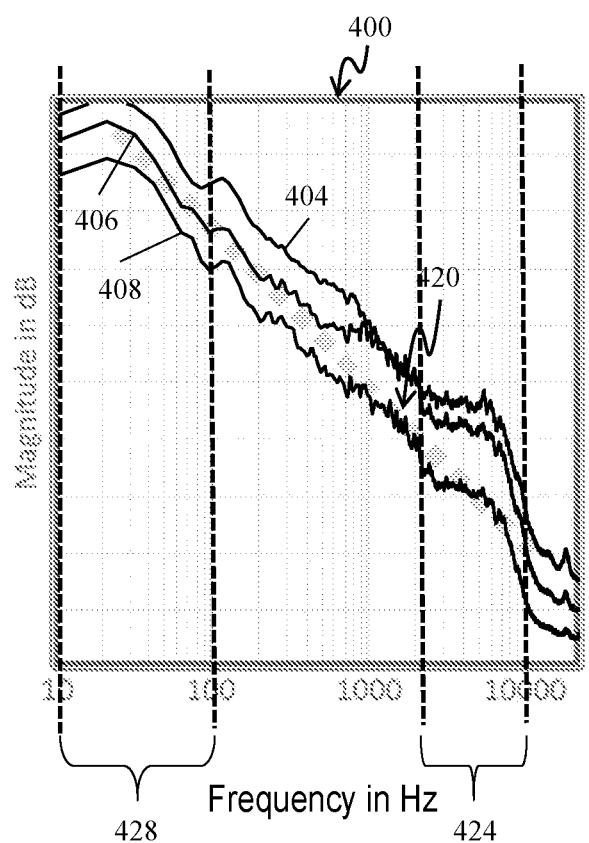
FIGS. 4A and 4B are plots of noise characteristics curves under different conditions.
Figure 4B:
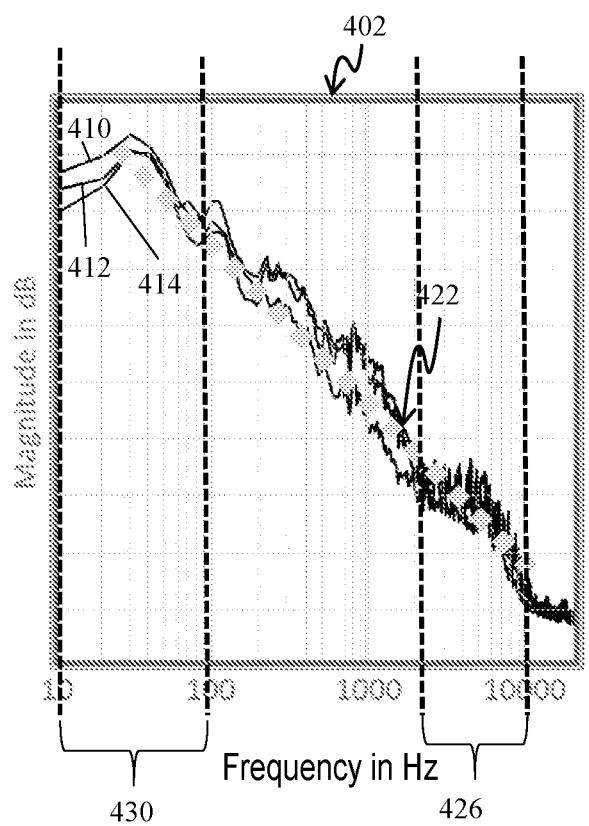

FIG. 4A contains a plot 400 of noise characteristics curves 404, 406, 408 showing the spectral shape of noise inside a vehicle moving at three different speeds, which have been measured with the vehicle's windows open. FIG. 4B contains a plot 402 of noise characteristics curves 410, 412, 414 inside the same moving vehicle at the same three different speeds, which have been measured with the vehicle's windows closed. The curves 404, 406, 408 have a generally common spectral shape that can be roughly represented by a linear curve 420 that extends from the low frequencies to the high frequencies. The curves 410, 412, 414 have another generally common spectral shape that can be roughly represented by a linear curve 422 that extends from the low frequencies to the high frequencies. In this example, all curves show that the major noise contribution is from the low-frequency band 428, 430, which can reach an upper cutoff frequency of up to 200 Hz. The similarities in the shape of each curve indicate that the shape of a noise spectrum is not significantly affected, in this example, by varying conditions such as vehicle speed. When noise in the low-frequencies rises with the vehicle speed, noise in the high-frequencies appears to rise proportionately.

However, the curves of the two different plots show dissimilarities around the high-frequency band 424, 426. A typical high-frequency band can be characterized by a lower cutoff frequency, which can be as low as 2, kHz, and an optional upper cutoff frequency above that. The dissimilarities in the high-frequency band may be caused by wind-noise differences experienced inside the vehicle when the windows are in different states (e.g., open or closed). In some implementations, the dissimilarities in the high-frequency band can also be caused by other condition changes. As the noise in the high-frequency band changes with different conditions, the linear curves 420, 422, which approximate the spectral shape of the noise, also change. A ratio of the magnitude of the noise energy at the low-frequency band 428 to the magnitude of the noise energy at the high-frequency band 424 is different from that of the magnitude of the noise energy in the low-frequency band 430 to the magnitude of the noise energy in the high-frequency band 426.

In some implementations, the adjustment map includes multiple adjustment curves each corresponding to a different noise spectrum represented by the ratio between the magnitudes of the noise energy in the low frequency band and the noise energy in the high-frequency band. Because of differences in the noise spectrum, the adjustment maps can be vehicle specific.

Figure 5A:
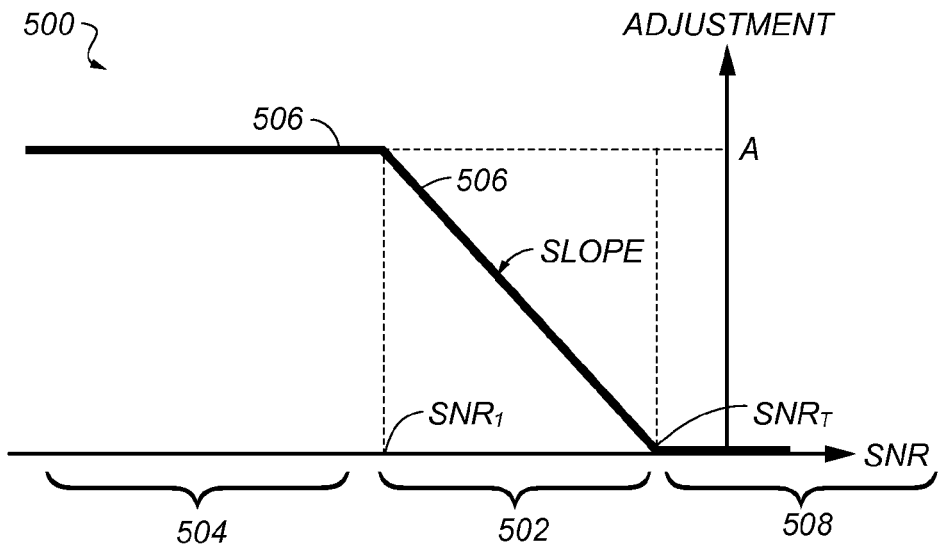
FIGS. 5A-5C are plots of example adjustment curves.

In some implementations, the adjustment curves in the map are based on the SNR estimated by the controller. In this instance, the SNR is the ratio between the estimated signal level, which is derived from the source-analysis module 304 and an estimated noise level, which is typically the magnitude of the noise energy associated with the low-frequency band for automobile vehicles. FIG. 5A shows a graph 500 that contains an example adjustment curve 506. The adjustment curve 506 is a mapping between the SNR depicted in decibels (dB) on the horizontal axis, and the adjustment value, e.g., gain, depicted also in decibels (dB) on the vertical axis. The curve 506 includes multiple linear regions. In this example, in a region 502 between an onset threshold SNR, $SNR_T$, and a specified SNR, $SNR_1$, the amount of adjustment linearly increases from zero dB to a maximum adjustment value of A dB; in a region 504 below $SNR_1$, a constant adjustment having the maximum value of A dB is applied; and in a region 508, above $SNR_T$, no adjustment, or an adjustment value of zero dB is applied. In some implementations, an adjustment curve may include more than two linear regions, each having a different slope.

In some implementations, an adjustment curve can be mathematically specified using one or more of the following parameters: the maximum adjustment value A, the number of linear regions, the slope of each linear region, the onset threshold $SNR_T$, and, if necessary, for each subsequent linear region, the starting SNR value for each region. In the example shown in FIG. 5A, the curve 506 can be specified once $SNR_T$, A, and the slope of the curve in the region 502 are determined.

Figure 5B:
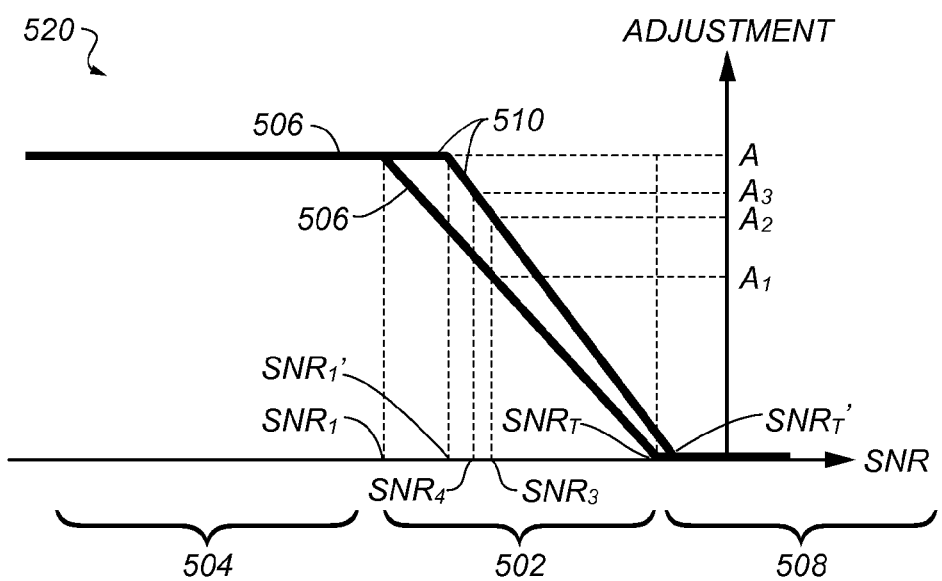

In some implementations, in a map for a given vehicle, different curves can be selected based on different noise characteristics associated with different conditions of the given vehicle. For example, for the curve 506 shown in plot 500 of FIG. 5A and plot 520 of FIG. 5B, an onset threshold $SNR_T$, and a slope of the curve in the region 502 can be selected based on the ratio between the noise energy in the high-frequency and the low-frequency bands discussed with respect to FIGS. 4A and 4B. The plot 520 also includes another curve 510, as shown in FIG. 5B, having an onset threshold $SNR_T'$ and the slope between the onset threshold $SNR_T'$ and a mid-level SNR, $SNR_1'$, that is different from the slope of the curve 506 in the region 502. The plot 520 of FIG. 5B can be considered as an adjustment map or part of an adjustment map.

Figure 5C:
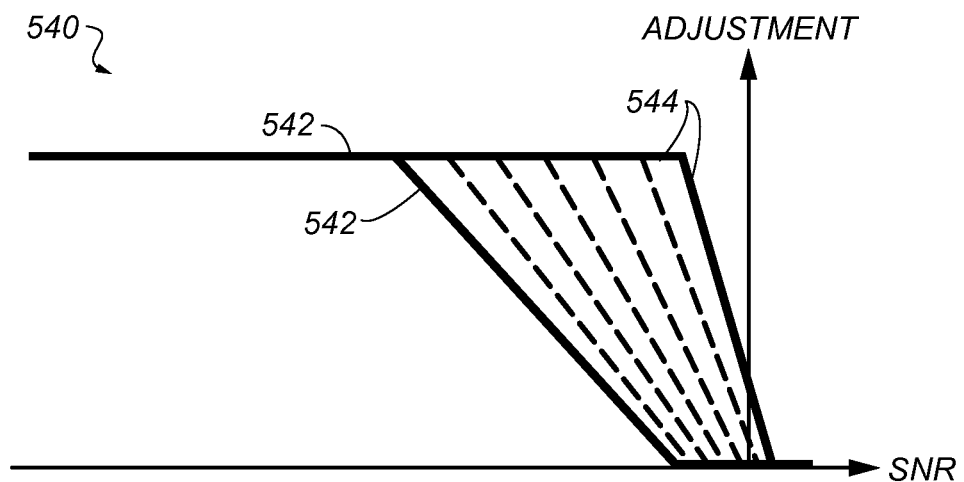

Referring to FIG. 5C, an adjustment map can include additional adjustment curves as compared to the plot 500 of FIG. 5A or the plot 520 of FIG. 5B, some of which, but not all, are shown in a plot 540. Each of these curves may be selected based on the aforementioned ratio between the noise energy levels of the low-frequency and high-frequency bands of the noise spectrum as depicted in FIGS. 4A and 4B. The group of adjustment curves in the map corresponds to a range of ratios caused by different conditions that lead to different relative levels of noise in the low- and high-frequency bands.

An adjustment map can be determined and programmed into an audio control system of a vehicle. The determination can be made empirically. In some implementations, two adjustment curves 542, 544 are respectively determined under two boundary conditions that correspond to an upper boundary of the range of ratios and a lower boundary of the range of ratios. All other curves can be created by linear interpolation between the two curves 542, 544. For example, a user can test drive a vehicle with all windows closed and with music or speech playing within the vehicle. Test equipment, e.g., including a built-in noise detector, such as the noise detector 102 of FIG. 1, and controller(s), such as the controller(s) 104 of FIG. 1, can be used to receive and analyze the effect of the noise on the sound. For example, SNRs at different times can be calculated. The user can test drive the vehicle under different road conditions and at different speeds. Once the user notices that a sound adjustment is required in order to obtain a consistent audio experience (as compared to when the vehicle is stationary or when the vehicle is under other conditions), the user can manually record or trigger the controller(s) to record the SNR at the moment as the onset SNR. The user can manually adjust the audio signals to reach a consistent audio experience at different times. The adjusted value can be recorded by the controller(s) in association with the SNRs at those different times. The slope of the adjustment curve, e.g., the slope of the curve 542 between $SNR_T'$ and $SNR_1$, can therefore be determined. Furthermore, a maximum adjustment amount A can be determined, e.g., when the vehicle is moving at maximum speed. The determined parameters for one curve can be stored in, or otherwise made accessible to, the controller(s).

Similarly, the user can test drive a vehicle with all windows open and with music or speech playing within the vehicle to construct another curve, e.g., the curve 544 of FIG. 5C. One or more additional curves can be built, e.g., with one window open and all other windows closed or under other conditions. As described previously, the one or more additional curves may also be constructed between the two curves 542, 544 using mathematical interpolation.

In addition, for each vehicle, an adjustment map having multiple adjustment curves can be constructed for each of a predetermined number of spectral bands. For example, using the empirical construction process described above, instead of adjusting the signal uniformly across the entire sound spectrum, the user adjusts the signals in different bands independently to maintain the desired consistency. For each SNR, the adjustments in the multiple bands are recorded to construct different adjustment maps for the different bands.

2. Implementations

As described above with respect to FIG. 2, one of multiple curves of a map determined for a vehicle may be selected in real time for use in real time sound adjustment. As used herein, "in real time" means "simultaneous with the music or speech being played in a moving vehicle." The selection can be based on the detected real time noise characteristics, e.g., the magnitude of the noise level in the low- and high-frequency bands and their ratio. For example, when the vehicle has the adjustment map partially shown in FIG. 5B and is driven with all windows open, the audio control system 100 (FIG. 1) of the vehicle determines the noise characteristics at that moment and chooses curve 510. The selection of the curve 510 affects the adjustment even when the real time SNR is found to be the same under the different conditions corresponding to the curves 506. For example, for the same real time $SNR_3$, an adjustment of $A_2$, is to be made to the audio signals, which is higher than an adjustment of $A_1$, had the curve 506 been chosen.

In reality, the real time SNR under the different conditions corresponding to the curves 506, 510 may be different. For example, if $SNR_3$, corresponds to the condition in which all windows of the vehicle are closed, then the actual SNR corresponding to the condition in which all windows of the vehicle are open is likely to be $SNR_4$, which is smaller than $SNR_3$. Using the curve 506, an actual adjustment of $A_3$, larger than both $A_1$, and $A_2$, is to be made to the audio signals.

Multi-Band Adjustment

Referring again to FIGS. 4A and 4B, the noise characteristics curves show that the noise energy is concentrated in the low frequencies. Differences in the spectral shape of the noise may lead to different effects on the sound. Different spectral components in the audio signal may also react differently to the noise. To maintain a tonal balance of the sound, the audio signals can be adjusted independently in different bands of its spectrum using different adjustment maps. Sound with appropriate tonal balance can be perceived as more natural by a user than that lacking an appropriate tonal balance.

Figure 6A:
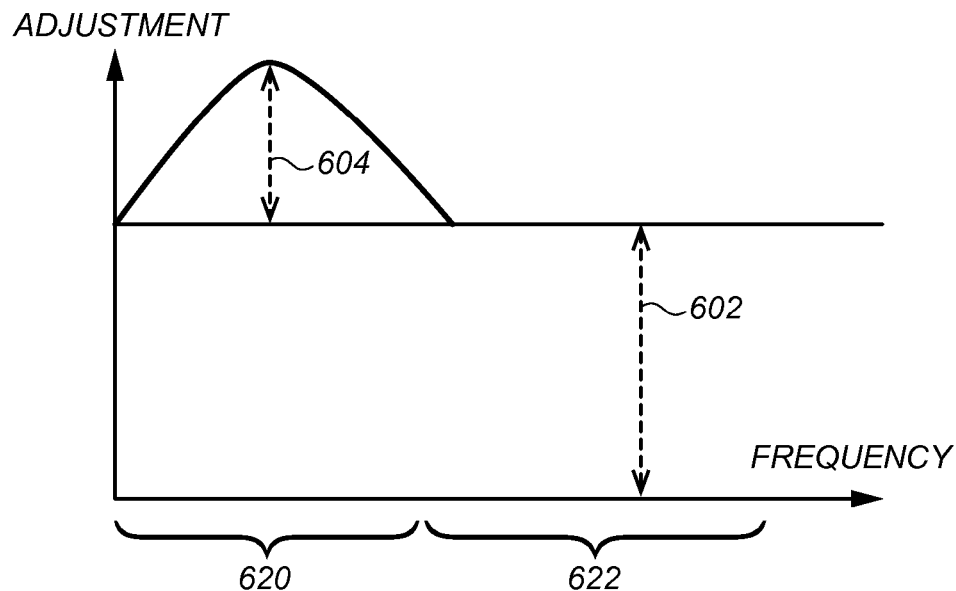
FIGS. 6A and 6B are plots of example double-band adjustment schemes.

FIG. 6A shows an example of a two-band adjustment scheme 600 for a vehicle at a given time. The entire spectrum of the input audio signals is separated into a band 620 that includes primarily the low frequencies, e.g., with a center peak at roughly 45, Hz and a band 622 that includes the rest of the frequencies in the spectrum and that extends to the maximum frequency represented by the specific digital representation of the input audio signal, also commonly known as the Nyquist frequency. The adjustment scheme 600 includes a wide-band boost 602 to be applied to the entire spectrum including both bands 620, 622. The adjustment scheme 600 also includes a bass boost 604 in the band 620, where the total adjustment is the sum of the wide-band boost 602 and the bass boost 604. The magnitudes of the wide-band boost and the bass boost are calculated in real time based on the adjustment values derived from the adjustment curves selected from the adjustment maps described previously. The spectral shapes of the wide-band boost 602 and the bass boost 604 can be pre-determined by the choice of filters used to effect the boosts. In this example, the wide-band boost 602 is implemented using a constant gain across the entire spectrum, while the bass boost 604 is implemented using a low-order band-pass filter.

Figure 6B:
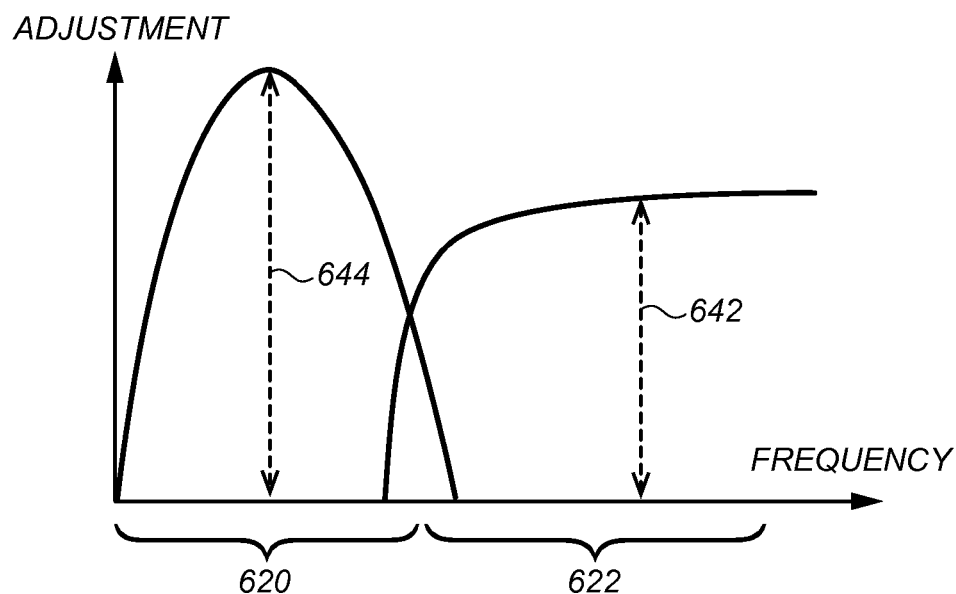

FIG. 6B shows an alternative scheme 640 to the scheme 600 that achieves the same adjustment for the same vehicle at the same given time. In the scheme 640, the adjustments in the two different bands 620, 640 are implemented independently with minimal spectral overlap. A typical lower-frequency band 620 can have DC (direct current, or zero frequency) as its lower bound and extend to an upper cutoff frequency, e.g., of up to 200, Hz. A typical higher-frequency band 640 can extend from the upper cutoff frequency of the lower-frequency band to the edge of the spectrum, or the Nyquist frequency. In other words, there is no boost that is applied to the entire spectrum. Instead, a boost 642 is applied to the band 622. The boost 642 has the same magnitude as the wide-band boost 602 in the band 622. A boost 644 is applied to the band 620. The boost 644 corresponds to the sum of the bass boost 604 and the wide-band boost 602 of FIG. 6A.

In some implementations, the audio signals are adjusted in three separate frequency bands of an entire sound spectrum. The three bands can include a low frequency band, e.g., the band 620 of FIGS. 6A and 6B, a mid-frequency band, and a treble band. For example, the band 622 of FIG. 6A and 6B can be split into the mid-frequency band and the treble band. In that example scenario, the low-frequency band extends from DC (zero frequency) to a cutoff frequency, e.g., of up to 200 Hz. The mid-frequency band extends from the cutoff frequency of the low-frequency band to a higher cutoff frequency, which can be between 3 to 6 kHz. The treble in turn extends from the upper cutoff frequency of the mid-frequency band and covers the remainder of the frequency range. Compared to a single band or two bands, the three-band adjustment can increase the flexibility in formulating adjustment curves independently for the mid-range and treble frequencies and can improve the tonal balance in the adjusted audio signals.

Figure 6C:
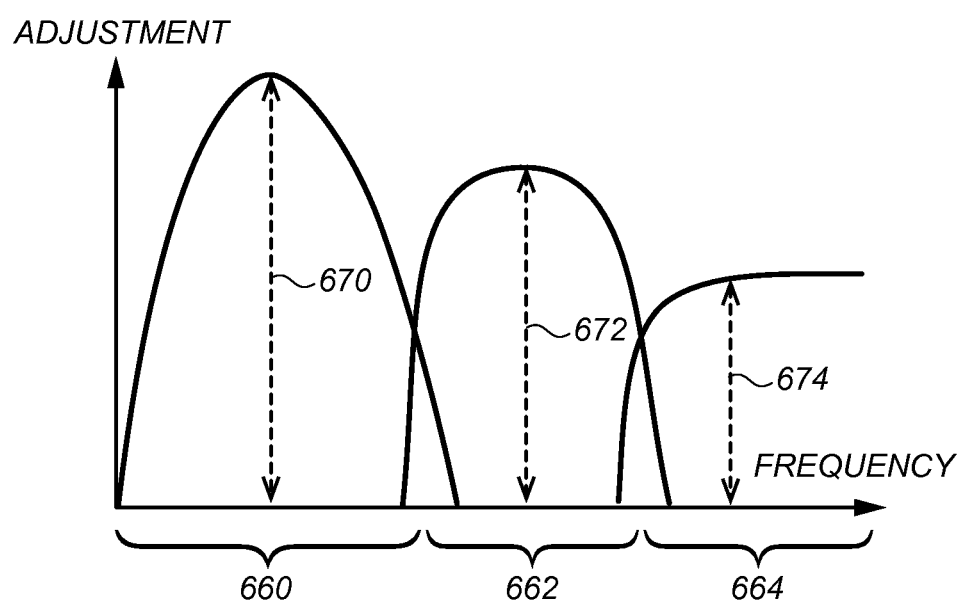
FIG. 6C is an example plot of a three-band adjustment scheme.

FIG. 6C shows an example of a three band adjustment scheme 650 for a vehicle at a given time. Adjustment to the audio signals can be made independently in three bands, including, e.g., a low-frequency band 660, a mid-frequency band 662, and a treble band 664. In this example, a bass boost 670, similar to the bass boost 644 of FIG. 6B, is applied in the band 660, a wide-band boost 674, similar to the wide-band boost 642, is applied in the band 664, and an adjustment 672 is applied to the band 662. Each of the boost 670, 672, 672 can be determined based on information about the current sound, the noise, and a chosen adjustment curve from a stored map for the vehicle. Compared to the scheme 640 of FIG. 6B or the scheme 600 of FIG. 6A, the scheme 650 allows the adjustment in the mid-frequency band 662 to be fine-tuned independently of the adjustments in the other two bands 660, 664.

In some implementations, the three-band adjustment scheme can provide a perceptual improvement to specific audio content, e.g., to speech. Energy in speech signals are typically concentrated in the mid-frequency region and the flexibility from having a dedicated adjustment map to the mid-frequencies can allow for more accurate adjustment in the presence of noise. In some implementations, an acoustic system of a vehicle provides surround sound presentations, with independent audio content coming from rear speakers.

When noise rises in the rear of the vehicle, e.g., when a rear-mounted engine is engaged, the content from the rear speakers may be swamped, jeopardizing the carefully-tuned surround presentation. In this scenario, the flexibility from having a dedicated adjustment map to the mid-frequencies can also allow the surround presentation to be preserved.

In some implementations, the sound spectrum can be separated into four or more bands. An adjustment map can be determined for each band, and the portion of audio signal in each band can be independently adjusted in real time.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems described in this specification, or portions of them, can be implemented in a computer program product that includes instructions that are stored on one or more non-transitory machine-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any claims or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. One or more non-transitory machine-readable media storing instructions that are executable by one or more processing devices to perform operations comprising:
    analyzing an effect of noise in an interior of a vehicle on sound in the interior of the vehicle, at least part of the sound being produced by audio signals;
    accessing a group of adjustment curves, wherein each adjustment curve in the group corresponds to a different noise spectrum, and has a slope that represents a ratio between magnitudes of (i) noise energy in a low frequency band, and (ii) noise energy in a high frequency band that includes frequencies larger than frequencies in the low frequency band
    selecting an adjustment curve among the group of adjustment curves based on one or more characteristics of the noise; and
    determining an amount of adjustment to be made to the audio signals based on the analyzed effect and the selected adjustment curve.

2. The one or more non-transitory machine-readable media of claim 1, wherein analyzing the effect of noise on the sound comprises calculating a signal to noise ratio.

3. The one or more non-transitory machine-readable media of claim 1, wherein the operations comprise determining the characteristics of the noise.

4. The one or more non-transitory machine-readable media of claim 3, wherein the characteristics of the noise comprise a first level of noise energy in a first frequency band and a second level of noise energy in a second frequency band.

5. The one or more non-transitory machine-readable media of claim 4, wherein the adjustment curve is selected based on a ratio of the first level to the second level.

6. The one or more non-transitory machine-readable media of claim 1, wherein the noise comprises wind noise.

7. The one or more non-transitory machine-readable media of claim 1, wherein the audio signals span a spectral frequency range, and selecting an adjustment curve comprises selecting a first adjustment curve from a first group of adjustment curves for a first band of the frequency range and selecting a second adjustment curve from a second group of adjustment curves for a second band of the frequency range.

8. The one or more non-transitory machine-readable media of claim 7, wherein determining an adjustment comprises determining a first adjustment for the audio signals in the first band and a second adjustment for the audio signals in the second band, the first and second adjustments being determined independently.

9. The one or more non-transitory machine-readable media of claim 1, wherein the analyzing, the selecting, and the determining are performed in real time.

10. The one or more non-transitory machine-readable media of claim 7, wherein selecting an adjustment curve comprises selecting a third adjustment curve from a third group of adjustment curves for a third band of the frequency range, and wherein the first, second and third bands form the spectral frequency range.

11. The one or more non-transitory machine-readable media of claim 1, wherein the operations comprise performing the adjustment to the audio signals.

12. A controller comprising:
    a processor; and
    a storage device that stores a program for execution by the processor, the program comprising instructions configured to cause the processor to perform operations comprising:
        analyzing an effect of noise in an interior of a vehicle on sound in the interior of the vehicle, at least part of the sound being produced by audio signals,
        accessing a group of adjustment curves, wherein each adjustment curve in the group corresponds to a different noise spectrum, and has a slope that represents a ratio between magnitudes of (i) noise energy in a low frequency band, and (ii) noise energy in a high frequency band that includes frequencies larger than frequencies in the low frequency band,
        selecting an adjustment curve among the group of adjustment curves based on one or more characteristics of the noise, and
        determining an amount of adjustment to be made to the audio signals based on the analyzed effect and the selected adjustment curve.

13. The controller of claim 12, wherein analyzing the effect of noise on the sound comprises calculating a signal to noise ratio.

14. The controller of claim 12, wherein the operations comprise determining the characteristics of the noise, and determining the characteristics of the noise comprises identifying first noise energy in a first frequency band and second noise energy in a second frequency band.

15. The controller of claim 14, wherein the adjustment curve is selected based on a ratio of the first noise energy to the second noise energy.

16. The controller of claim 12, wherein the audio signals span a spectral frequency range and selecting an adjustment curve comprises selecting a first adjustment curve from a first group of adjustment curves for a first band of the frequency range, and selecting a second adjustment curve from a second group of adjustment curves for a second band of the frequency range.

17. The controller of claim 16, wherein determining an adjustment comprises determining a first adjustment for the audio signals in the first band and a second adjustment for the audio signals in the second band, the first and second adjustments being determined independently.

18. The controller of claim 16, wherein the analyzing, selecting, and determining are performed in real time.

19. The controller of claim 16, wherein selecting an adjustment curve further comprises selecting a third adjustment curve from a third group of adjustment curves for a third band of the frequency range, and the first, second and third bands form the spectral frequency range.

20. A system comprising:
an acoustic system for producing audio signals;
a detector for detecting sound, at least part of the sound being produced by the audio signals and the sound comprising noise; and
a controller configured to perform operations comprising:
analyzing an effect of noise in interior of a vehicle on sound in the of the vehicle,
accessing a representation of a group of adjustment curves, wherein each adjustment curve in the group corresponds to a different noise spectrum, and has a slope that represents a ratio between magnitudes of (i) noise energy in a low frequency band, and (ii) noise energy in a high frequency band that includes frequencies larger than frequencies in the low frequency band,
selecting an adjustment curve among the group of adjustment curves based on one or more characteristics of the noise, and
determining an amount of adjustment to be made to the audio signals based on the analyzed effect and the selected adjustment curve.

21. The system of claim 20, wherein analyzing the effect of noise on the sound comprises calculating a signal to noise ratio.

22. The system of claim 20, wherein the controller is configured to determine the one or more characteristics of the noise.

23. The system of claim 22, wherein the one or more characteristics of the noise comprise a first level of noise energy in a first frequency band and a second level of noise energy in a second frequency band.

24. The system of claim 23, wherein the adjustment curve is selected based on a ratio of the first level to the second level.

25. The system of claim 20, wherein the spatial unit comprises a cabin of a moving vehicle and the noise comprises wind noise.

26. The system of claim 20, wherein the audio signals span a spectral frequency range and selecting an adjustment curve comprises selecting a first adjustment curve from a first group of adjustment curves for a first band of the frequency range and selecting a second adjustment curve from a second group of adjustment curves for a second band of the frequency range.

27. The system of claim 26, wherein determining an adjustment comprises determining a first adjustment for the audio signals in the first band and a second adjustment for the audio signals in the second band, the first and second adjustments being determined independently.

28. The system of claim 20, wherein the analyzing, the selecting, and the determining are performed substantially in real time.

29. The system of claim 26, wherein selecting an adjustment curve comprises selecting a third adjustment curve from a third group of adjustment curves for a third band of the frequency range, and the first, second and third bands form the spectral frequency range.

30. The system of claim 20, wherein the controller is further configured to perform the adjustment to the audio signals.

* * * * *